(12) United States Patent
Chang et al.

(10) Patent No.: US 11,723,147 B2
(45) Date of Patent: Aug. 8, 2023

(54) SENSOR LENS ASSEMBLY HAVING NON-REFLOW CONFIGURATION

(71) Applicant: KINGPAK TECHNOLOGY INC., Hsin-Chu County (TW)

(72) Inventors: Chia-Shuai Chang, Hsin-Chu County (TW); Chien-Chen Lee, Hsin-Chu County (TW); Jui-Hung Hsu, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 3 days.

(21) Appl. No.: 17/667,486

(22) Filed: Feb. 8, 2022

(65) Prior Publication Data

US 2022/0361327 A1 Nov. 10, 2022

Related U.S. Application Data

(60) Provisional application No. 63/184,622, filed on May 5, 2021.

(30) Foreign Application Priority Data

Nov. 12, 2021 (TW) .................... 110142150

(51) Int. Cl.
*G02B 7/00* (2021.01)
*H05K 1/11* (2006.01)
(Continued)

(52) U.S. Cl.
CPC .............. *H05K 1/111* (2013.01); *G02B 7/006* (2013.01); *G02B 7/02* (2013.01); *H05K 1/0274* (2013.01);
(Continued)

(58) Field of Classification Search
CPC ................. H05K 1/111; H05K 1/0274; H05K 2201/09409; H05K 2201/09445;
(Continued)

(56) References Cited

U.S. PATENT DOCUMENTS

2007/0267712 A1* 11/2007 Fujita ................ H01L 27/14618
257/E31.093
2009/0128681 A1* 5/2009 Kim ...................... H04N 23/57
348/335
(Continued)

*Primary Examiner* — Steven T Sawyer
(74) *Attorney, Agent, or Firm* — Li & Cai Intellectual Property Office

(57) ABSTRACT

A sensor lens assembly having a non-reflow configuration is provided. The sensor lens assembly includes a circuit board, an electronic chip assembled to the circuit board, a sensor chip, a die attach film (DAF) pre-bonded onto the sensor chip, a plurality of wires electrically coupling the electronic chip and the sensor chip to the circuit board, a supporting adhesive layer, a light-permeable sheet, and an optical module that is fixed to the circuit board for surrounding the above components. The sensor chip is adhered to the electronic chip through the DAF such that a sensing region of the sensor chip is perpendicular to a central axis of the optical module. The supporting adhesive layer is in a ringed shape and is disposed on a top surface of the sensor chip. The light-permeable sheet is disposed on the supporting adhesive layer and faces the sensor chip.

11 Claims, 10 Drawing Sheets

(51) Int. Cl.
 *G02B 7/02* (2021.01)
 *H05K 1/02* (2006.01)
(52) U.S. Cl.
 CPC .............. *H05K 2201/09409* (2013.01); *H05K 2201/09445* (2013.01); *H05K 2201/10121* (2013.01); *H05K 2201/10151* (2013.01)
(58) Field of Classification Search
 CPC .......... H05K 2201/10121; H05K 2201/10151; H05K 1/181; H05K 2203/049; G02B 7/006; G02B 7/02; G02B 13/16; G02B 27/021; H01L 27/14618; H01L 27/14625; H01L 2224/48091; H01L 2224/48227; H01L 2924/09701; H01L 2924/3025; H04N 23/54; G03B 30/00
 See application file for complete search history.

(56) References Cited

U.S. PATENT DOCUMENTS

| | | | |
|---|---|---|---|
| 2017/0163859 A1* | 6/2017 | Dobashi | G02B 7/006 |
| 2018/0176430 A1* | 6/2018 | Wang | H01L 27/14645 |
| 2021/0104480 A1* | 4/2021 | Chung | H01L 24/06 |

* cited by examiner

SENSOR LENS ASSEMBLY HAVING NON-REFLOW CONFIGURATION

CROSS-REFERENCE TO RELATED PATENT APPLICATION

This application claims the benefit of priority to Taiwan Patent Application No. 110142150, filed on Nov. 12, 2021. The entire content of the above identified application is incorporated herein by reference.

This application claims priority to the U.S. Provisional Patent Application Ser. No. 63/184,622 filed on May 5, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor lens assembly, and more particularly to a sensor lens assembly having a non-reflow configuration.

BACKGROUND OF THE DISCLOSURE

A conventional sensor lens assembly is manufactured by fixing a sensor package structure onto a circuit board during a reflow process and then assembling an optical module to the circuit board. However, a structural configuration of the conventional sensor lens assembly is limited by the sensor package structure, so that the structural configuration of the conventional sensor lens assembly is difficult to be improved. For example, since the sensor package structure of the conventional sensor lens assembly needs to undergo the reflow process for being fixed onto the circuit board, a connection part between any two components of the sensor package structure must be able to resist high temperatures.

SUMMARY OF THE DISCLOSURE

In response to the above-referenced technical inadequacy, the present disclosure provides a sensor lens assembly having a non-reflow configuration to effectively improve on the issues associated with conventional sensor lens assemblies.

In one aspect, the present disclosure provides a sensor lens assembly having a non-reflow configuration, which includes a circuit board, an optical module, an electronic chip, a plurality of first wires, a sensor chip, a die attach film (DAF), a plurality of second wires, a supporting adhesive layer, and a light-permeable sheet. The circuit board has a first surface and a second surface that is opposite to the first surface. The first surface of the circuit board includes a chip-bonding region, a plurality of first soldering pads arranged outside of the chip-bonding region, and a plurality of second soldering pads that are arranged outside of the first soldering pads. The optical module includes a frame, at least one lens, and a filtering sheet. The frame is fixed on the first surface of the circuit board. The at least one lens is assembled into the frame, and a central axis of the at least one lens passes through the chip-bonding region. The filtering sheet is assembled into the frame and is positioned along the central axis. The frame, the filtering sheet, and the first surface jointly define a distribution space, and the chip-bonding region, the first soldering pads, and the second soldering pads are arranged in the distribution space. The electronic chip is disposed on the chip-bonding region and includes a plurality of first connection pads that are arranged on a top side thereof. The first soldering pads are respectively and electrically coupled to the first connection pads through the first wires. The sensor chip includes a sensing region arranged on a top surface thereof and a plurality of second connection pads that are arranged on the top surface and outside of the sensing region, and the DAF is adhered to a bottom surface of the sensor chip. The sensor chip is adhered to the top side of the electronic chip through the DAF such that the sensing region is perpendicular to the central axis. The second soldering pads are respectively and electrically coupled to the second connection pads through the second wires. The supporting adhesive layer is in a ringed shape and is disposed outside of the sensing region. The light-permeable sheet is disposed on the supporting adhesive layer and faces the sensor chip, so that the light-permeable sheet, the supporting adhesive layer, and the top surface of the sensor chip jointly define an enclosed space.

Therefore, through cooperation of the above components, the sensor lens assembly provided by the present disclosure does not need to go through any reflow process through the non-reflow configuration thereof, such as to allow that the component relationships arranged in the distribution space (e.g., connection between any two of the electronic chip, the sensor chip, the DAF, the first wires, the second wires, the supporting adhesive layer, and the light-permeable sheet) just need to satisfy a lower level of high-temperature resistance requirement. Accordingly, material cost of the sensor lens assembly can be decreased, and the product yield of the sensor lens assembly can be increased.

Specifically, since the sensor lens assembly of the present disclosure does not need to go through a reflow process, the sensor lens assembly does not need to be subjected to relevant testing processes, thereby effectively simplifying the entire production process to improve the production efficiency of the sensor lens assembly.

In addition, the sensor lens assembly in the present embodiment is provided by using the DAF to be pre-bonded onto the bottom surface of the sensor chip, so that the sensor chip can be firmly and flatly adhered to the electronic chip, thereby realizing a miniaturized architecture for a multi-chip stacked structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
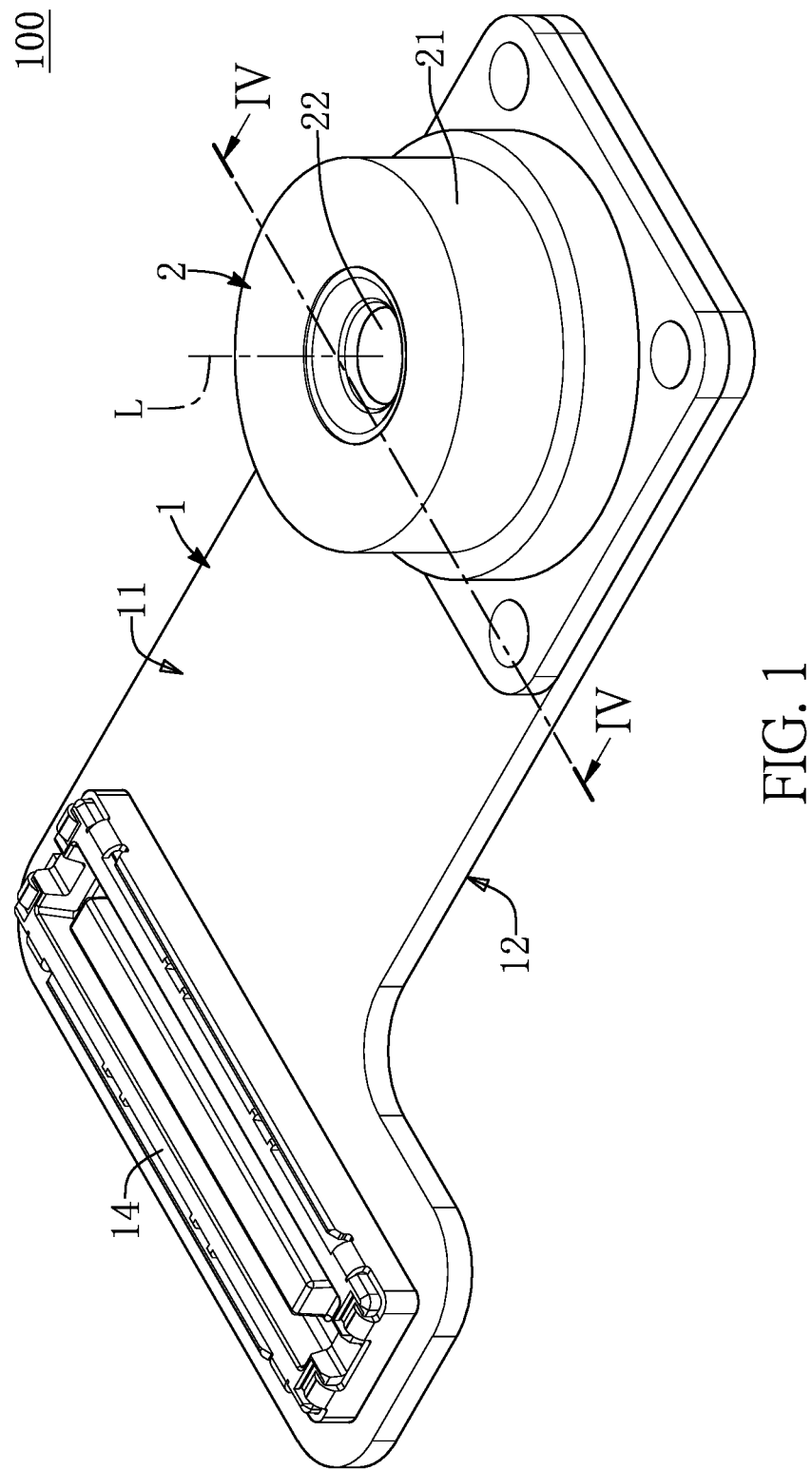
FIG. 1 is a perspective view of a sensor lens assembly having a non-reflow configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
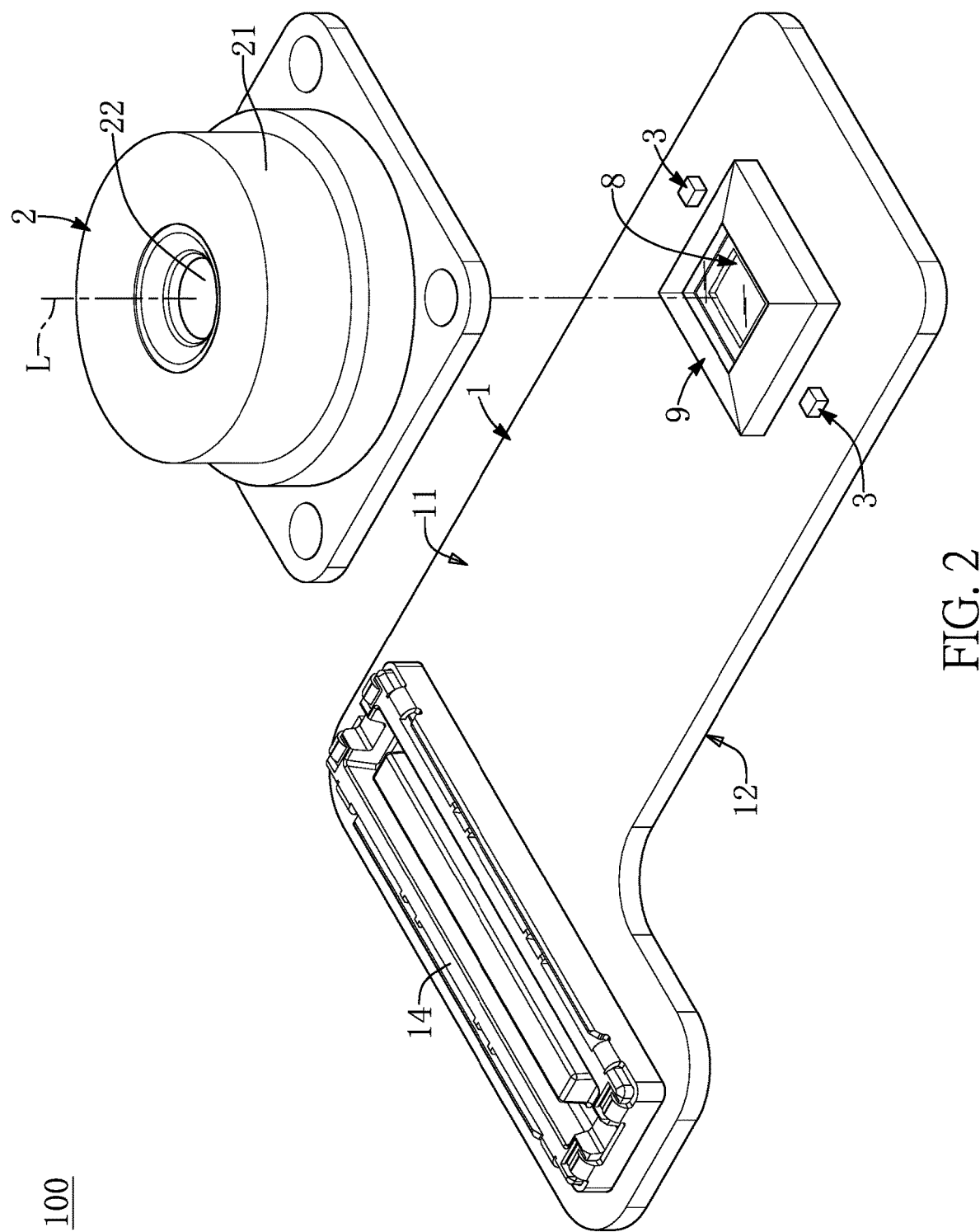
FIG. 2 is an exploded view of FIG. 1.

Referring to FIG. 1 to FIG. 5, a first embodiment of the present disclosure provides a sensor lens assembly 100 having a non-reflow configuration. As shown in FIG. 1 and FIG. 2, the sensor lens assembly 100 of the present embodiment does not have any package structure therein. In other words, any sensor lens assembly which has a package structure or is formed by implementing a reflow process is different from the sensor lens assembly 100 of the present embodiment.

Figure 3:
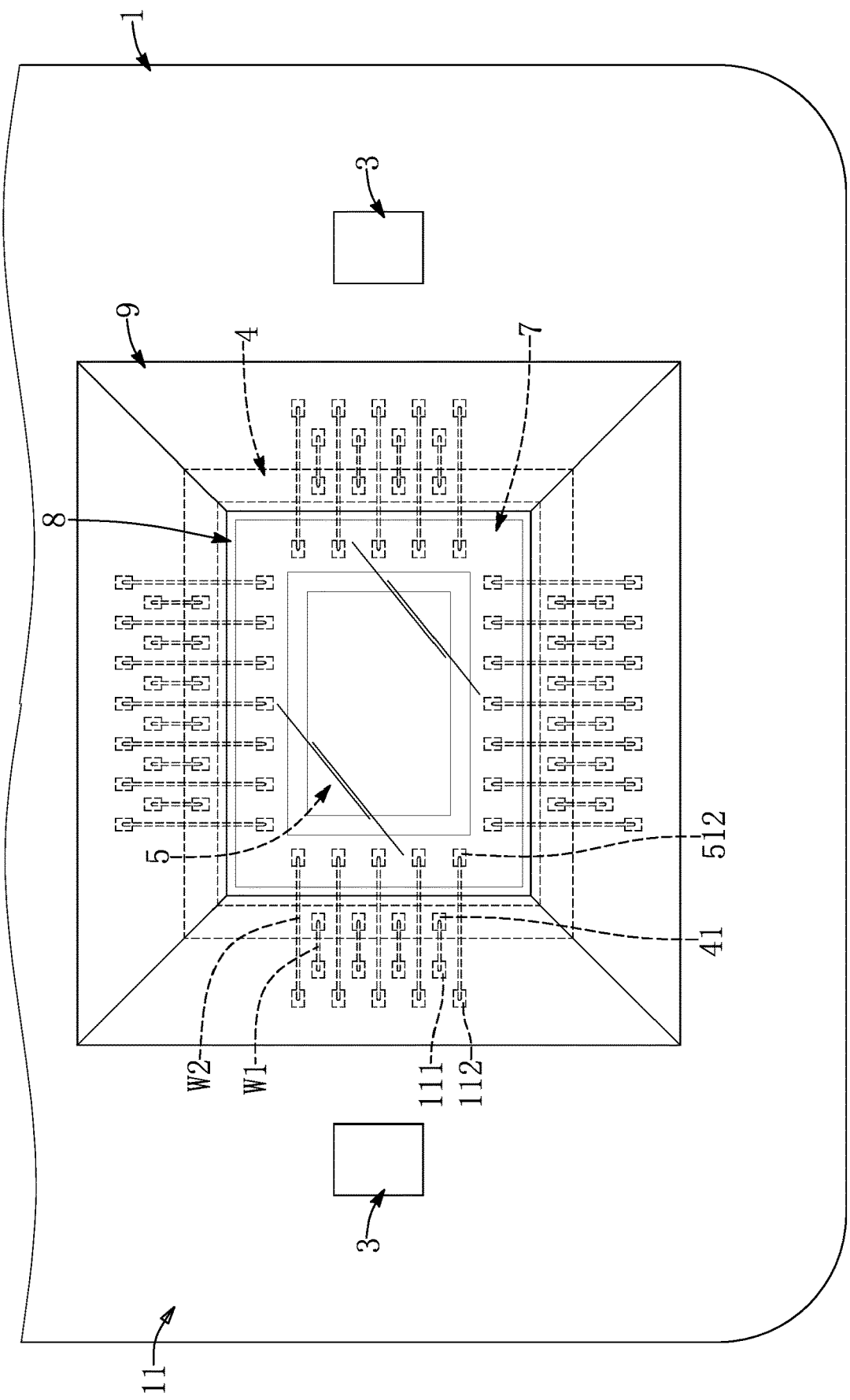
FIG. 3 is a partial top view of FIG. 2 when an optical module is omitted.
Figure 4:
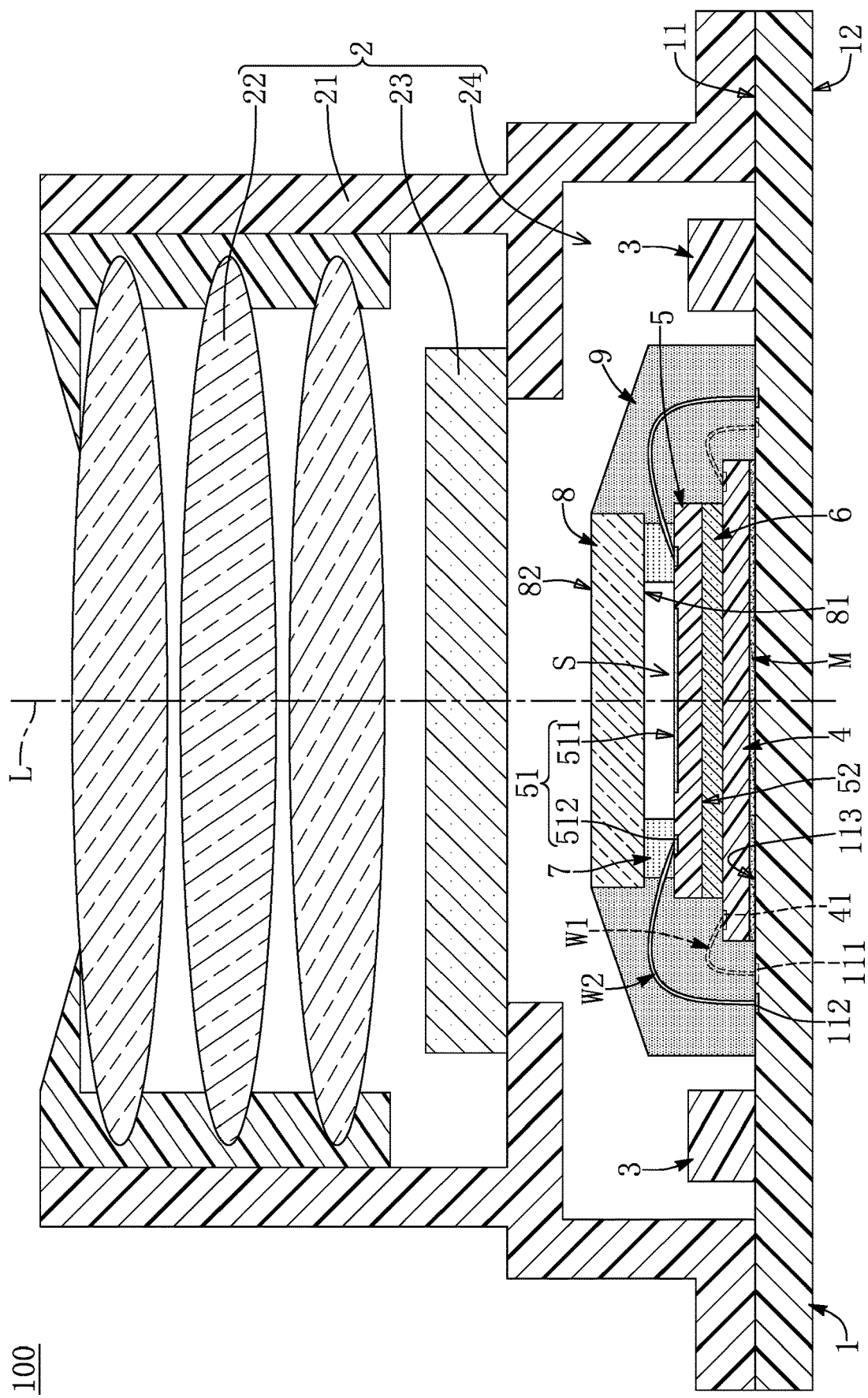
FIG. 4 is a cross-sectional view taken along line IV-IV of FIG. 1.

As shown in FIG. 3 and FIG. 4, the sensor lens assembly 100 includes a circuit board 1, an optical module 2 fixed to the circuit board 1, at least one passive electronic component 3 assembled to the circuit board 1, an electronic chip 4 assembled to the circuit board 1, a plurality of first wires W1 electrically coupling the electronic chip 4 and the circuit board 1, a sensor chip 5, a die attach film (DAF) 6 pre-bonded onto the sensor chip 5 and adhered to the electronic chip 4, a plurality of second wires W2 electrically coupling the sensor chip 5 and the circuit board 1, a supporting adhesive layer 7 disposed on the sensor chip 5, a light-permeable sheet 8 disposed on the supporting adhesive layer 7, and a sealing compound 9.

The sensor lens assembly 100 in the present embodiment is described to include the above components, but the sensor lens assembly 100 can be adjusted or changed according to design requirements. For example, in other embodiments of the present disclosure not shown in the drawings, the sensor lens assembly 100 can be provided by omitting the at least one passive electronic component 3 and/or the sealing compound 9.

The circuit board 1 in the present embodiment can be a printed circuit board (PCB) or a flexible printed circuit (FPC), but the present disclosure is not limited thereto. The circuit board 1 has a first surface 11 and a second surface 12 that is opposite to the first surface 11. The first surface 11 is parallel to the second surface 12, and the circuit board 1 has no slot recessed in the first surface 11.

Moreover, the circuit board 1 includes a chip-bonding region 113 arranged on the first surface 11, a plurality of first soldering pads 111 arranged on the first surface 11 and outside of the chip-bonding region 113, and a plurality of second soldering pads 112 that are arranged on the first surface 11 and outside of the first soldering pads 111. Exemplarily, the first soldering pads 111 are respectively staggered with respect to the second soldering pads 112, thereby reducing the difficulty of a wiring process that is implemented for the first soldering pads 111 and the second soldering pads 112.

In addition, as shown in FIG. 1 and FIG. 2, the circuit board 1 can be provided with an electrical connector 14. The circuit board 1 is configured to be detachably connected to an electronic device (not shown in the drawings) through the electrical connector 14, so that the sensor lens assembly 100 can be assembled to and electrically connected to the electronic device. In other words, the circuit board 1 is not only used for carrying the electronic chip 4 and the sensor chip 5, but also provided for carrying and being electrically coupled to other electronic components. Accordingly, the circuit board 1 in the present embodiment is different from a substrate conventionally provided in a package structure.

As shown in FIG. 3 and FIG. 4, the optical module 2 includes a frame 21, at least one lens 22 assembled into the frame 21, and a filtering sheet 23 assembled into the frame 21. A bottom of the frame 21 is fixed to the first surface 11 of the circuit board 1, a central axis L of the at least one lens 22 passes through the chip-bonding region 113, and the filtering sheet 23 is positioned along the central axis L. The at least one passive electronic component 3 is assembled to the first surface 11 of the circuit board 1 and is arranged adjacent to the frame 21. Moreover, a quantity of the at least one passive electronic component 3 can be adjusted or changed according to design requirements, and outer lateral edges of the circuit board 1 can be partially flush with the frame 21 (e.g., three of the outer lateral edges of the circuit board 1 are flush with the frame 21), but the present disclosure is not limited thereto.

Specifically, a quantity of the at least one lens 22 in the present embodiment is more than one, and the central axes L of the multiple ones of the lens 22 are overlapped with each other, and the filtering sheet 23 is located between the lenses 22 and the chip-bonding region 113. The frame 21, the filtering sheet 23, and the first surface 11 of the circuit board 1 jointly define a distribution space 24. Moreover, the chip-bonding region 113, the first soldering pads 111, the second soldering pads 112, the at least one passive electronic component 3, the electronic chip 4, the DAF 6, the sensor chip 5, the first wires W1, the second wires W2, the supporting adhesive layer 7, the light-permeable sheet 8, and the sealing compound 9 are arranged in the distribution space 24.

The electronic chip 4 in the present embodiment is an image signal processor (ISP), but the present disclosure is not limited thereto. The electronic chip 4 is disposed on the chip-bonding region 113, and includes a plurality of first connection pads 41 arranged on a top side thereof.

It should be noted that the sensor lens assembly 100 in the present embodiment includes an adhesive M (e.g., a thermally conductive adhesive) disposed on the chip-bonding region 113, and the electronic chip 4 is fixed to the chip-bonding region 113 through the adhesive M (e.g., a bottom side of the electronic chip 4 is adhered to the chip-bonding region 113 through the adhesive M), but the present disclosure is not limited thereto. For example, in other embodiments of the present disclosure not shown in the drawings, the adhesive M can be omitted or can be replaced with other components.

In the present embodiment, the first soldering pads 111 are in a ring-shaped arrangement, and the first connection pads 41 are in a substantially ring-shaped arrangement and preferably correspond in position to the first soldering pads 111, respectively, but the present disclosure is not limited thereto. For example, in other embodiments of the present disclosure not shown in the drawings, the first soldering pads 111 can be arranged in two rows that are respectively located at two opposite sides of the chip-bonding region 113, the first connection pads 41 can also be arranged in two rows, and the first connection pads 41 respectively correspond in position to the first soldering pads 111.

The first wires W1 electrically couple the first soldering pads 111 to the first connection pads 41, respectively. In other words, each of the first wires W1 is formed in a wiring manner, so that two opposite ends of each of the first wires W1 are respectively connected to one of the first soldering pads 111 and the corresponding first connection pad 41. Moreover, the wiring manner of any one of the first wires W1 can be a normal bonding manner or a reverse bonding manner according to design requirements, and the present disclosure is not limited thereto.

The sensor chip 5 in the present embodiment is an image sensor chip, and the size of the sensor chip 5 is smaller than that of the electronic chip 4, but the present disclosure is not limited thereto. The DAF 6 is adhered to a bottom surface 52 of the sensor chip 5 (e.g., the bottom surface 52 of the sensor chip 5 is pre-bonded with the DAF 6 to ensure its flatness), and the sensor chip is adhered to the top side of the electronic chip 4 through the DAF 6, so that a top surface 51 of the sensor chip 5 (e.g., the sensing region 411) can be perpendicular to the central axis L. In the present embodiment, the DAF 6 is adhered to a portion of the top side of the electronic chip 4 arranged inside of the first connection pads 41, that is to say, the first connection pads 41 are arranged outside of the DAF 6, but the present disclosure is not limited thereto.

Accordingly, the sensor lens assembly in the present embodiment is provided by using the DAF 6 to be pre-bonded onto the bottom surface 52 of the sensor chip 5, so that the sensor chip 5 can be firmly and flatly adhered to the electronic chip 4, thereby implementing a miniaturization of multi-chip stacked configuration.

Moreover, the sensor chip 5 includes a sensing region 511 arranged on the top surface 51 and a plurality of second connection pads 512 that are arranged on the top surface 51 and outside of the sensing region 511. The filtering sheet 23 is chosen according to (or corresponding to) the sensing region 511 of the sensor chip 5. For example, when light passes through the at least one lens 22, the filtering sheet 23 is configured to (only) allow the light of a wavelength band corresponding to the sensing region 511 to pass therethrough.

In the present embodiment, the second soldering pads 112 are in a ring-shaped arrangement, the second connection pads 512 arranged on the top surface 51 surround the sensing region 511 in a substantially ring-shaped arrangement, and the second connection pads 512 preferably correspond in position to the second soldering pads 112, respectively, but the present disclosure is not limited thereto. For example, in other embodiments of the present disclosure not shown in the drawings, the second connection pads 512 can be arranged in two rows that are respectively located at two opposite sides of the sensing region 511, the second soldering pads 112 can also be arranged in two rows, and the second connection pads 512 respectively correspond in position to the second soldering pads 112.

The second wires W2 electrically couple the second soldering pads 112 to the second connection pads 512, respectively. In other words, each of the second wires W2 is formed in a wiring manner, so that two opposite ends of each of the second wires W2 are respectively connected to one of the second soldering pads 112 and the corresponding second connection pad 512. Moreover, the wiring manner of any one of the second wires W2 can be a normal bond manner or a reverse bond manner according to design requirements, and the present disclosure is not limited thereto.

Moreover, the supporting adhesive layer 7 is in a ringed shape and is disposed on the top surface 51 of the sensor chip 5. The supporting adhesive layer 7 surrounds or is arranged outside of the sensing region 511, and each of the second connection pads 512 and a part of the corresponding second wire W2 connected thereto can be embedded in the supporting adhesive layer 7, but the present disclosure is not limited thereto.

The light-permeable sheet 8 has an inner surface 81 and an outer surface 82. The inner surface 81 of the light-permeable sheet 8 is disposed on the supporting adhesive layer 7 and faces the sensing region 511 of the sensor chip 5 (i.e., the supporting adhesive layer 7 is sandwiched between the top surface 51 of the sensor chip 5 and the inner surface 81 of the light-permeable sheet 8), so that the light-permeable sheet 8, the supporting adhesive layer 7, and the top surface 51 of the sensor chip 5 jointly define an enclosed space S. The sensing region 511 is arranged in the enclosed space S and faces the light-permeable sheet 8.

Figure 5:
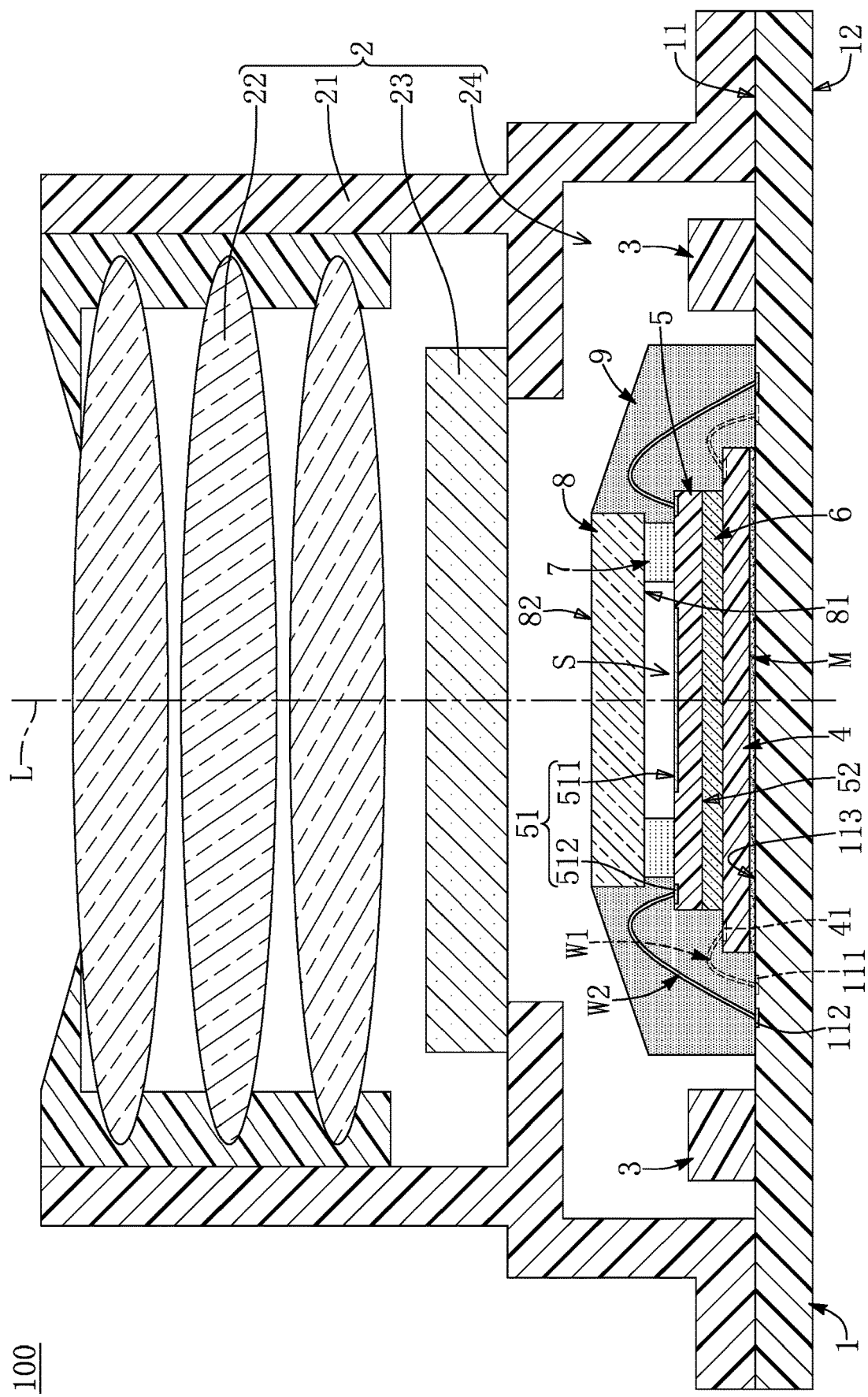
FIG. 5 is a cross-sectional view showing the sensor lens assembly of FIG. 4 in another configuration.

As shown in FIG. 4, the sealing compound 9 is formed on the first surface 11 of the circuit board 1. The sealing compound 9 surrounds the electronic chip 4, the DAF 6, the sensor chip 5, the supporting adhesive layer 7, and the light-permeable sheet 8. Moreover, the first soldering pads 111, the first connection pads 112, the first wires W1, the second soldering pads 112, and a part of each of the second wires W2 are embedded in the sealing compound 9, but the present disclosure is not limited thereto. For example, as shown in FIG. 5, the second connection pads 512 are arranged outside of the supporting adhesive layer 7, so that the second connection pads 512 and the second wires W2 are embedded in the sealing compound 9.

In summary, through cooperation of the above components, the sensor lens assembly 100 in the present embodiment does not need to go through any reflow process through the non-reflow configuration thereof, such as to allow that the component relationships arranged in the distribution space 24 just need to satisfy a lower level of high-temperature resistance requirement. Accordingly, material cost of the sensor lens assembly 100 can be decreased, and the product yield of the sensor lens assembly 100 can be increased.

Specifically, since the sensor lens assembly 100 of the present embodiment does not need to go through a reflow process, the sensor lens assembly 100 does not need to be subjected to relevant testing processes, thereby effectively simplifying the entire production process to improve the production efficiency of the sensor lens assembly 100.

Second Embodiment

Figure 6:
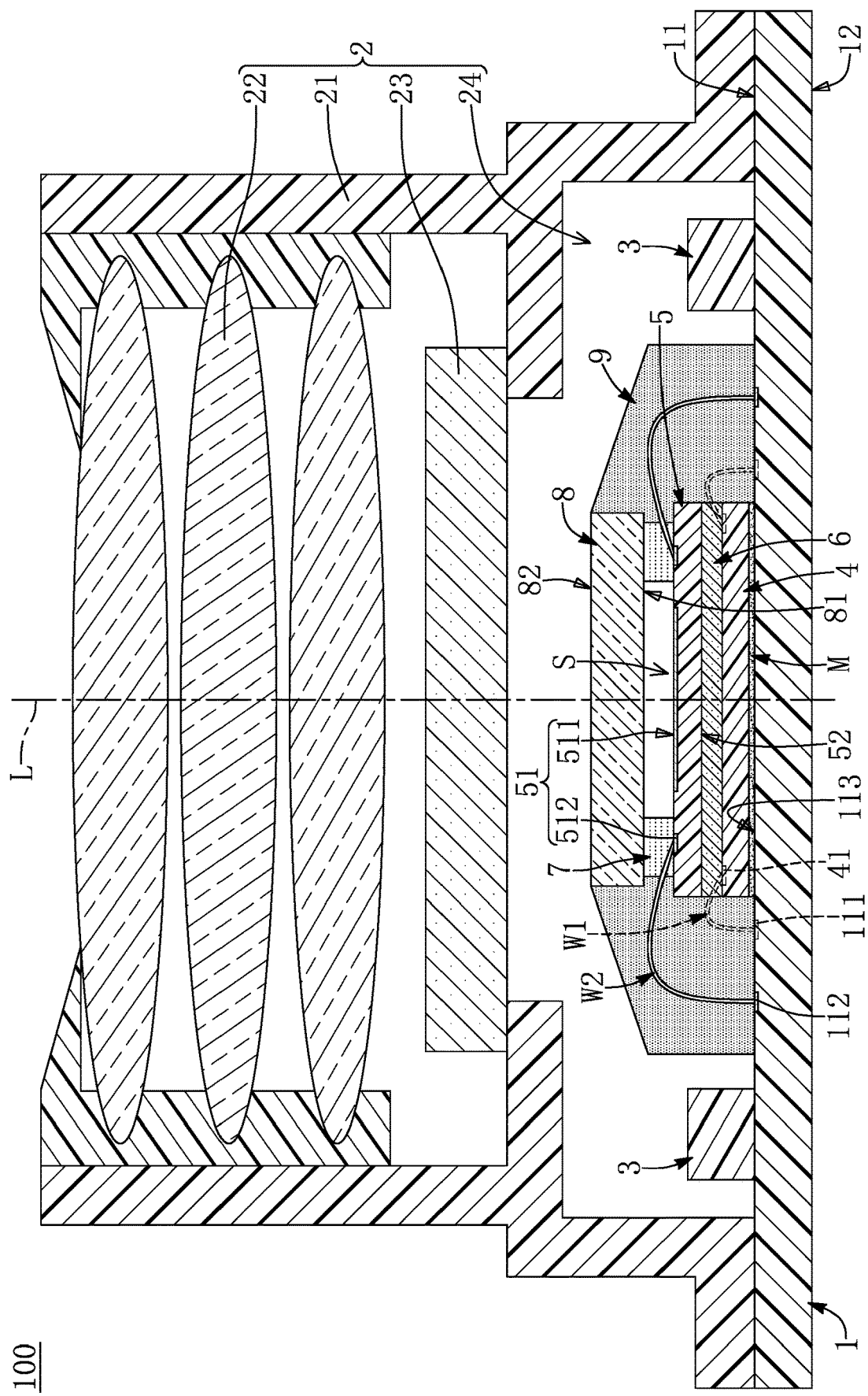
FIG. 6 is a cross-sectional view of the sensor lens assembly according to a second embodiment of the present disclosure.
Figure 7:
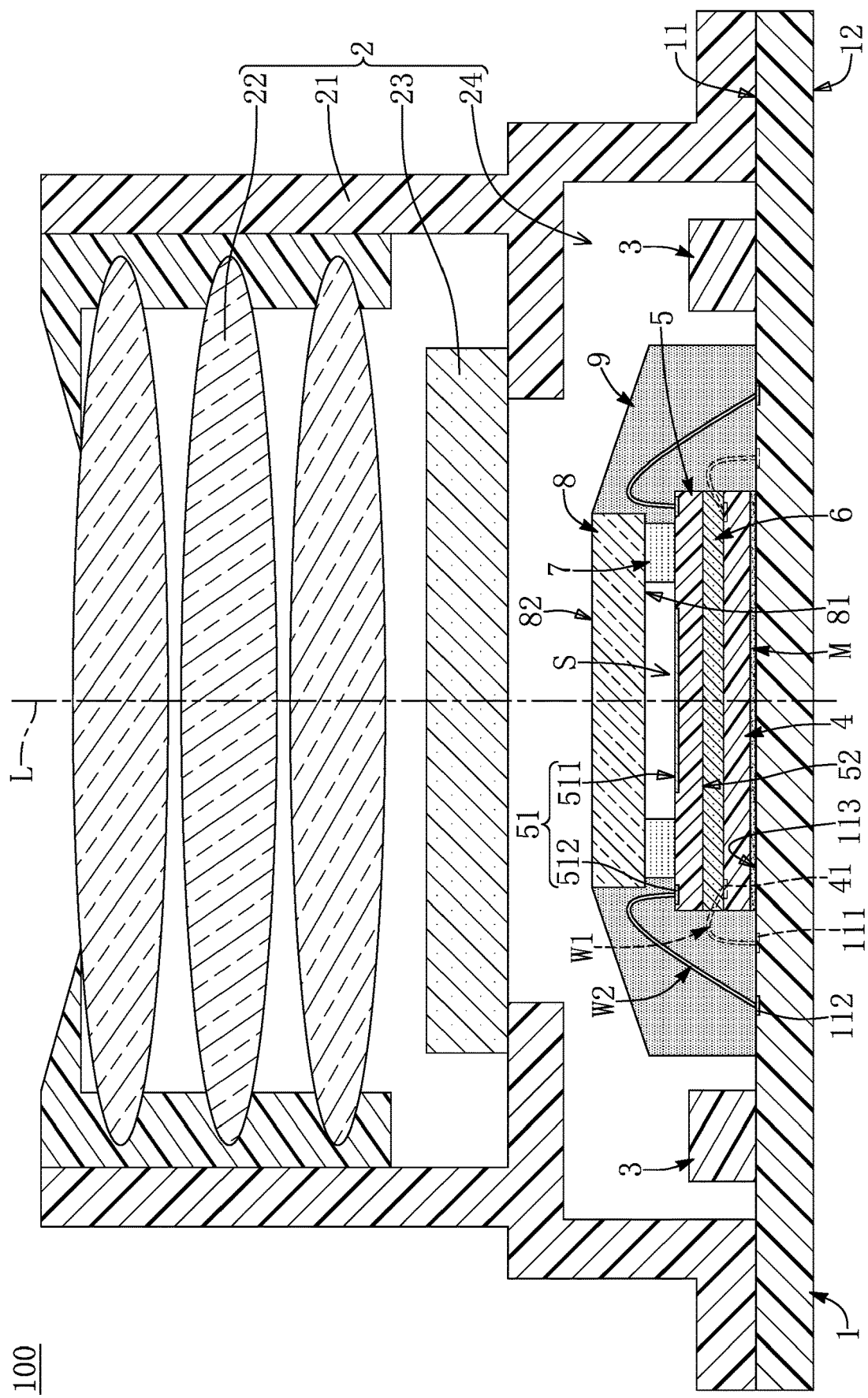
FIG. 7 is a cross-sectional view showing the sensor lens assembly of FIG. 6 in another configuration.

Referring to FIG. 6 and FIG. 7, a second embodiment of the present disclosure is provided, which is similar to the first embodiment of the present disclosure. For the sake of brevity, descriptions of the same components in the first and second embodiments of the present disclosure will be omitted herein, and the following description discloses the different features between the first and second embodiments.

In the present embodiment, the size of the sensor chip 5 is substantially equal to that of the electronic chip 4, and the DAF 6 pre-bonded onto the sensor chip 5 is substantially adhered to or covers the entirety of the top side of the electronic chip 4. Each of the first connection pads 41 and a part of the corresponding first wire W1 connected thereto are embedded in the DAF 6, and the other part of each of the first wires W1 is embedded in the sealing compound 9, but the present disclosure is not limited thereto. For example, in other embodiments of the present disclosure not shown in the drawings, at least one of the first connection pads 41 and a part of the corresponding first wire W1 connected thereto are embedded in the DAF 6.

Third Embodiment

Figure 8:
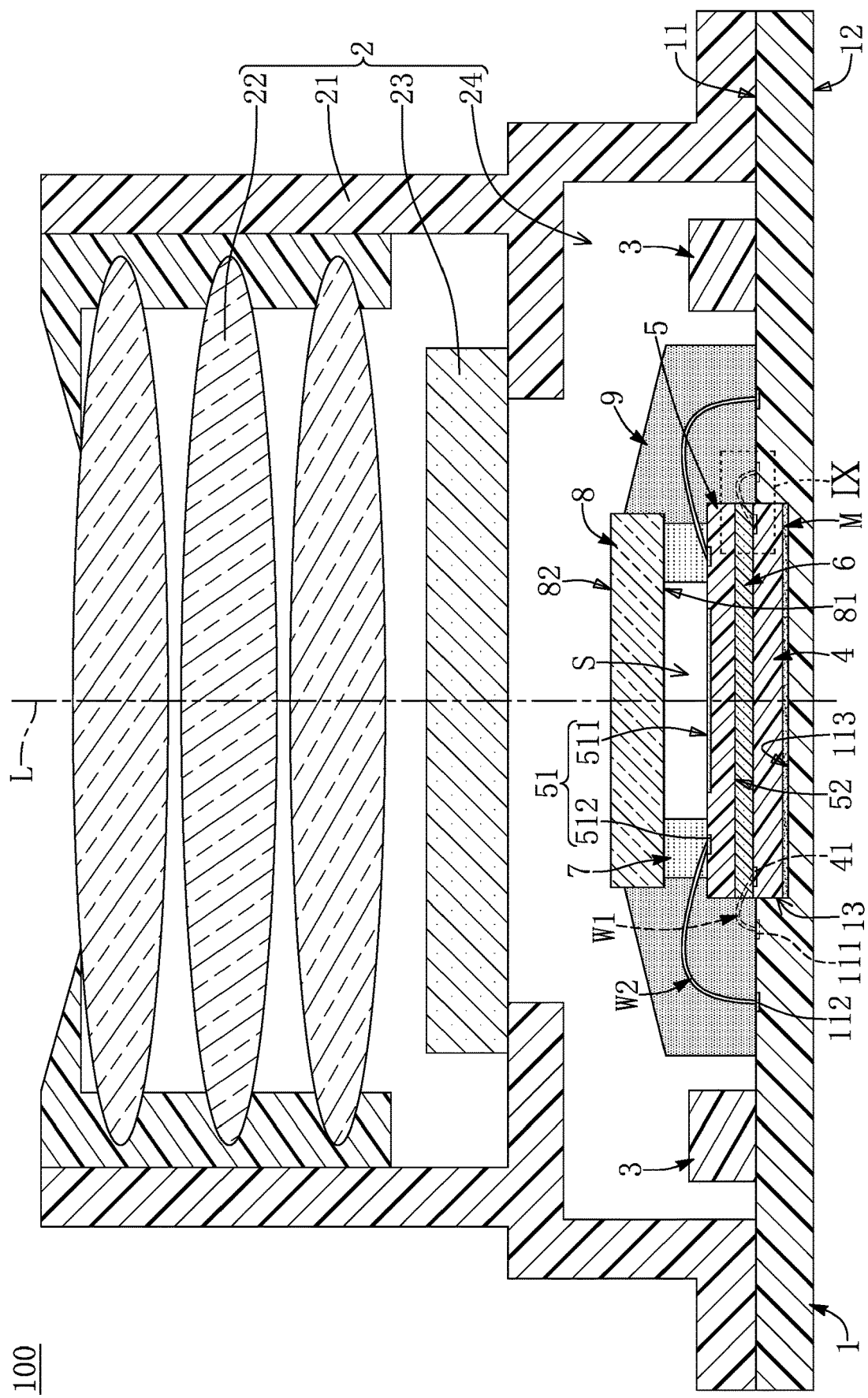
FIG. 8 is a cross-sectional view of the sensor lens assembly according to a third embodiment of the present disclosure.
Figure 9:
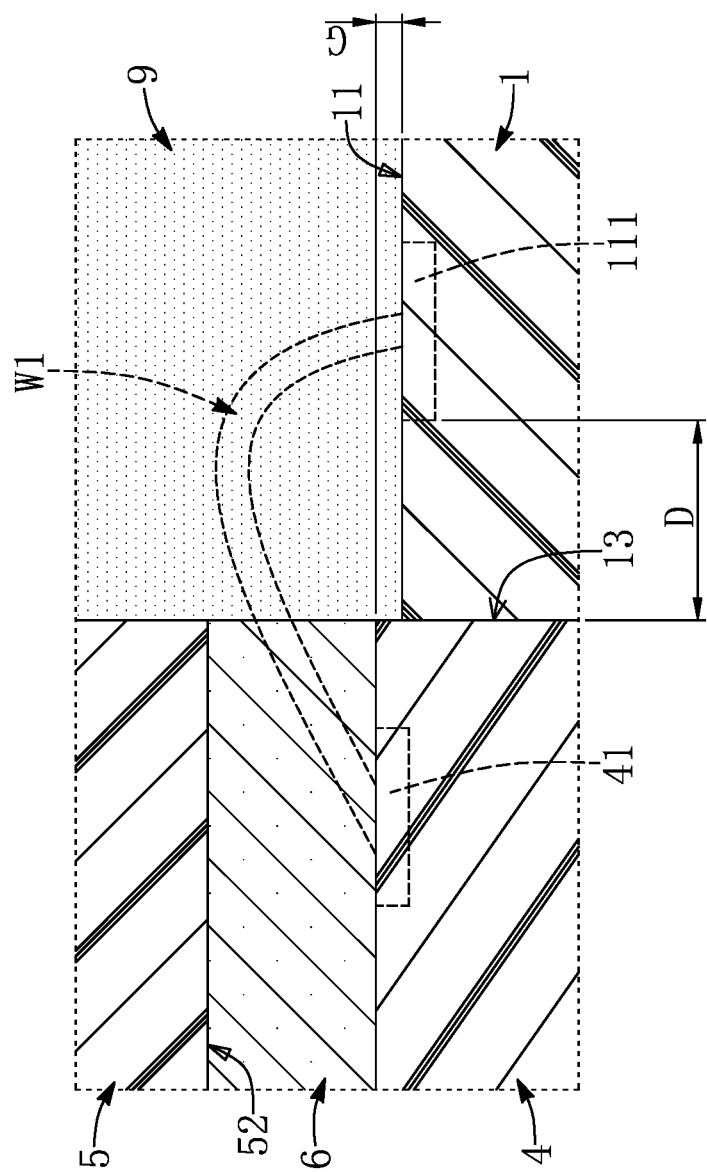
FIG. 9 is an enlarged view of part IX of FIG. 8.
Figure 10:
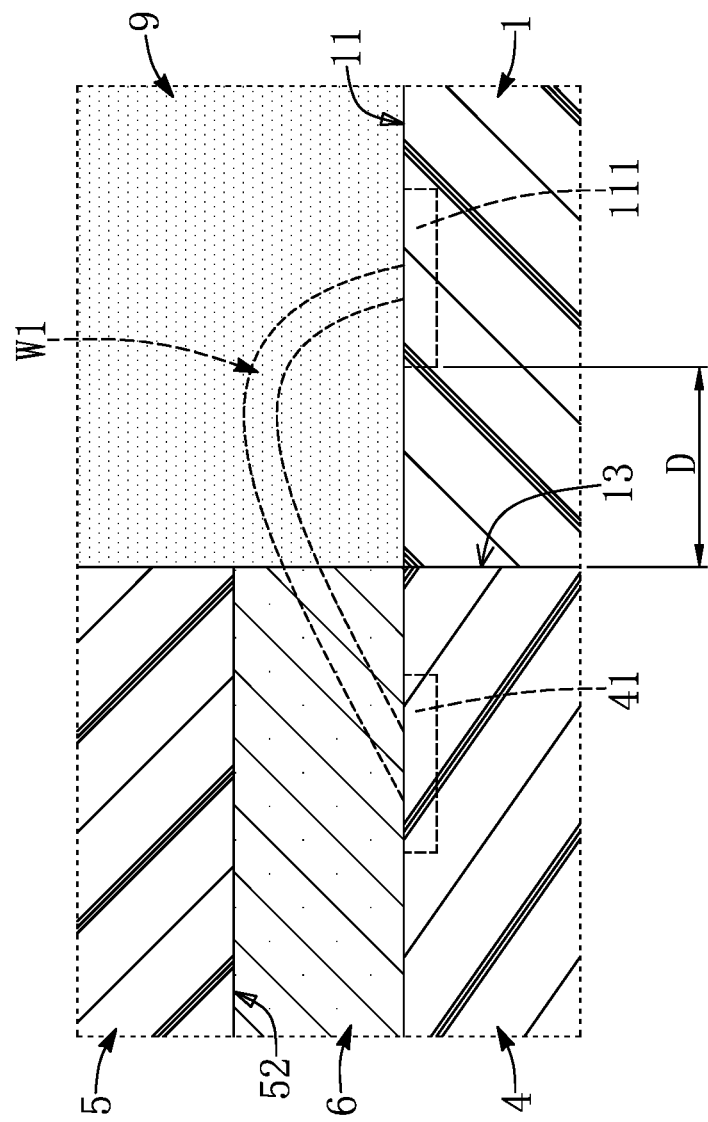
FIG. 10 is a cross-sectional view showing the sensor lens assembly of FIG. 9 in another configuration.

Referring to FIG. 8 to FIG. 10, a third embodiment of the present disclosure is provided, which is similar to the second embodiment of the present disclosure. For the sake of brevity, descriptions of the same components in the second and third embodiments of the present disclosure will be omitted herein, and the following description discloses the different features between the second and third embodiments.

In the present embodiment, the circuit board 1 has a chip-receiving slot 13 recessed in the chip-bonding region 113. In other words, the first soldering pads 111 are arranged outside of the chip-receiving slot 13, and each of the first soldering pads 111 is spaced apart from the chip-receiving slot 13 by a spacing distance D that is preferably less than or equal to 100 μm, but the present disclosure is not limited thereto.

The electronic chip 4 is disposed in the chip-receiving slot 13 of the circuit board 1 (e.g., a bottom side of the electronic chip 4 faces a bottom of the chip-receiving slot 13). Moreover, the top side of the electronic chip 4 and the first surface 11 of the circuit board 1 have a step difference G therebetween that is less than or equal to 10 μm. In other words, the step difference G can be less than or equal to 5 μm, and the step difference G is preferably zero (e.g., as shown in FIG. 10, the top side of the electronic chip 4 is coplanar with the first surface 11 of the circuit board 1). Furthermore, the first wires W1 electrically couple the first connection pads 41 to the first soldering pads 111, respectively, and each of the first connection pads 41 and a part of the corresponding first wire W1 connected thereto are embedded in the DAF 6.

Accordingly, the sensor lens assembly 100 in the present embodiment is provided with an electronic chip 4 that is disposed in the chip-receiving slot 13 by a specific condition (e.g., the step difference G is less than or equal to 10 μm), so that formation of each of the first wires W1 is no longer limited by height of the electronic chip 4, and the distance between any one of the first soldering pads 111 and the corresponding first connection pad 41 can be reduced.

It should be noted that the adhesive M (e.g., the thermally conductive adhesive) of the sensor lens assembly 100 in the present embodiment is disposed in the chip-receiving slot 13, and the electronic chip 4 is fixed in the chip-receiving slot 13 through the adhesive M (e.g., the bottom side of the electronic chip 4 is adhered to a bottom of the chip-receiving slot 13 through the adhesive M), but the present disclosure is not limited thereto. For example, in other embodiments of the present disclosure not shown in the drawings, the adhesive M can be omitted or can be replaced with other components.

Beneficial Effects of the Embodiments

In conclusion, through cooperation of the above components, the sensor lens assembly provided by the present disclosure does not need to go through any reflow process through the non-reflow configuration thereof, such as to allow that the component relationships arranged in the distribution space (e.g., connection between any two of the electronic chip, the sensor chip, the DAF, the first wires, the second wires, the supporting adhesive layer, and the light-permeable sheet) just need to satisfy a lower level of high-temperature resistance requirement. Accordingly, material cost of the sensor lens assembly can be decreased, and the product yield of the sensor lens assembly can be increased.

Specifically, since the sensor lens assembly of the present disclosure does not need to go through a reflow process, the sensor lens assembly does not need to be subjected to relevant testing processes, thereby effectively simplifying the entire production process to improve the production efficiency of the sensor lens assembly.

In addition, the sensor lens assembly in the present embodiment is provided by using the DAF to be pre-bonded onto the bottom surface of the sensor chip, so that the sensor chip can be firmly and flatly adhered to the electronic chip, thereby realizing a miniaturized architecture for a multi-chip stacked structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor lens assembly having a non-reflow configuration, comprising:
a circuit board having a first surface and a second surface that is opposite to the first surface, wherein the first surface of the circuit board includes a chip-bonding region, a plurality of first soldering pads arranged outside of the chip-bonding region, and a plurality of second soldering pads that are arranged outside of the first soldering pads;
an optical module including:
a frame fixed on the first surface of the circuit board;
at least one lens assembled into the frame, wherein a central axis of the at least one lens passes through the chip-bonding region; and
a filtering sheet assembled into the frame and positioned along the central axis, wherein the frame, the filtering sheet, and the first surface jointly define a distribution space, and the chip-bonding region, the first soldering pads, and the second soldering pads are arranged in the distribution space;
an electronic chip disposed on the chip-bonding region and including a plurality of first connection pads that are arranged on a top side thereof;
a plurality of first wires, wherein the first soldering pads are respectively and electrically coupled to the first connection pads through the first wires;
a sensor chip and a die attach film (DAF), wherein the sensor chip includes a sensing region arranged on a top surface thereof and a plurality of second connection pads that are arranged on the top surface and outside of the sensing region, and the DAF is adhered to a bottom surface of the sensor chip, and wherein the sensor chip is adhered to the top side of the electronic chip through the DAF such that the sensing region is perpendicular to the central axis;
a plurality of second wires, wherein the second soldering pads are respectively and electrically coupled to the second connection pads through the second wires;
a supporting adhesive layer being in a ringed shape and disposed outside of the sensing region; and
a light-permeable sheet, wherein the light-permeable sheet is disposed on the supporting adhesive layer and faces the sensor chip, so that the light-permeable sheet, the supporting adhesive layer, and the top surface of the sensor chip jointly define an enclosed space;
wherein the first soldering pads and the second soldering pads are staggered with respect to each other, respectively.

2. The sensor lens assembly according to claim 1, further comprising a sealing compound formed on the first surface, wherein the sealing compound surrounds the electronic chip, the DAF, the sensor chip, the supporting adhesive layer, and the light-permeable sheet, and wherein at least part of each of the first wires, at least part of each of the second wires, the first connection pads, and the second connection pads are embedded in the sealing compound.

3. The sensor lens assembly according to claim 2, wherein the first connection pads are arranged outside of the DAF, and the first wires and the first connection pads are embedded in the sealing compound.

4. The sensor lens assembly according to claim 2, wherein at least one of the first connection pads and a part of the corresponding first wire connected thereto are embedded in the DAF.

5. The sensor lens assembly according to claim 4, wherein the circuit board has a chip-receiving slot recessed in the chip-bonding region, the electronic chip is disposed in the chip-receiving slot, and the top side of the electronic chip and the first surface of the circuit board have a step difference therebetween that is less than or equal to 10 μm.

6. The sensor lens assembly according to claim 2, wherein the first surface is parallel to the second surface, and the circuit board has no slot recessed in the first surface.

7. The sensor lens assembly according to claim 2, wherein at least one of the second connection pads is arranged outside of the supporting adhesive layer and is embedded in the sealing compound.

8. The sensor lens assembly according to claim 2, wherein at least one of the second connection pads and a part of the corresponding second wire connected thereto are embedded in the supporting adhesive layer.

9. The sensor lens assembly according to claim 1, wherein, when light passes through the at least one lens, the filtering sheet is configured to allow the light of a wavelength band corresponding to the sensing region to pass therethrough, and wherein the sensor lens assembly includes at least one passive electronic component arranged in the distribution space and assembled onto the first surface of the circuit board.

10. A sensor lens assembly having a non-reflow configuration, comprising:
a circuit board having a first surface and a second surface that is opposite to the first surface, wherein the first surface of the circuit board includes a chip-bonding region, a plurality of first soldering pads arranged outside of the chip-bonding region, and a plurality of second soldering pads that are arranged outside of the first soldering pads;
an optical module including:
a frame fixed on the first surface of the circuit board;
at least one lens assembled into the frame, wherein a central axis of the at least one lens passes through the chip-bonding region; and
a filtering sheet assembled into the frame and positioned along the central axis, wherein the frame, the filtering sheet, and the first surface jointly define a distribution space, and the chip-bonding region, the first soldering pads, and the second soldering pads are arranged in the distribution space;
an electronic chip disposed on the chip-bonding region and including a plurality of first connection pads that are arranged on a top side thereof;
a plurality of first wires, wherein the first soldering pads are respectively and electrically coupled to the first connection pads through the first wires;
a sensor chip and a die attach film (DAF), wherein the sensor chip includes a sensing region arranged on a top surface thereof and a plurality of second connection pads that are arranged on the top surface and outside of the sensing region, and the DAF is adhered to a bottom surface of the sensor chip, and wherein the sensor chip is adhered to the top side of the electronic chip through the DAF such that the sensing region is perpendicular to the central axis;
a plurality of second wires, wherein the second soldering pads are respectively and electrically coupled to the second connection pads through the second wires;
a supporting adhesive layer being in a ringed shape and disposed outside of the sensing region;
a light-permeable sheet, wherein the light-permeable sheet is disposed on the supporting adhesive layer and faces the sensor chip, so that the light-permeable sheet, the supporting adhesive layer, and the top surface of the sensor chip jointly define an enclosed space; and a sealing compound formed on the first surface, wherein the sealing compound surrounds the electronic chip, the DAF, the sensor chip, the supporting adhesive layer, and the light-permeable sheet, wherein at least part of each of the first wires, at least part of each of the second wires, the first connection pads, and the second connection pads are embedded in the sealing compound;

wherein at least one of the first connection pads and a part of the corresponding first wire connected thereto are embedded in the DAF.

11. A sensor lens assembly having a non-reflow configuration, comprising:

a circuit board having a first surface and a second surface that is opposite to the first surface, wherein the first surface of the circuit board includes a chip-bonding region, a plurality of first soldering pads arranged outside of the chip-bonding region, and a plurality of second soldering pads that are arranged outside of the first soldering pads;

an optical module including:
a frame fixed on the first surface of the circuit board;
at least one lens assembled into the frame, wherein a central axis of the at least one lens passes through the chip-bonding region; and
a filtering sheet assembled into the frame and positioned along the central axis, wherein the frame, the filtering sheet, and the first surface jointly define a distribution space, and the chip-bonding region, the first soldering pads, and the second soldering pads are arranged in the distribution space;

an electronic chip disposed on the chip-bonding region and including a plurality of first connection pads that are arranged on a top side thereof;

a plurality of first wires, wherein the first soldering pads are respectively and electrically coupled to the first connection pads through the first wires;

a sensor chip and a die attach film (DAF), wherein the sensor chip includes a sensing region arranged on a top surface thereof and a plurality of second connection pads that are arranged on the top surface and outside of the sensing region, and the DAF is adhered to a bottom surface of the sensor chip, and wherein the sensor chip is adhered to the top side of the electronic chip through the DAF such that the sensing region is perpendicular to the central axis;

a plurality of second wires, wherein the second soldering pads are respectively and electrically coupled to the second connection pads through the second wires;

a supporting adhesive layer being in a ringed shape and disposed outside of the sensing region;

a light-permeable sheet, wherein the light-permeable sheet is disposed on the supporting adhesive layer and faces the sensor chip, so that the light-permeable sheet, the supporting adhesive layer, and the top surface of the sensor chip jointly define an enclosed space; and a sealing compound formed on the first surface, wherein the sealing compound surrounds the electronic chip, the DAF, the sensor chip, the supporting adhesive layer, and the light-permeable sheet, wherein at least part of each of the first wires, at least part of each of the second wires, the first connection pads, and the second connection pads are embedded in the sealing compound;

wherein at least one of the second connection pads and a part of the corresponding second wire connected thereto are embedded in the supporting adhesive layer.

* * * * *